United States Patent
Bauer (10) Patent No.: US 7,897,491 B2
(45) Date of Patent: Mar. 1, 2011

(54) SEPARATE INJECTION OF REACTIVE SPECIES IN SELECTIVE FORMATION OF FILMS

(75) Inventor: Matthias Bauer, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 12/639,388

(22) Filed: Dec. 16, 2009

(65) Prior Publication Data

US 2010/0093159 A1     Apr. 15, 2010

Related U.S. Application Data

(62) Division of application No. 11/963,627, filed on Dec. 21, 2007, now Pat. No. 7,655,543.

(51) Int. Cl.
*H01L 21/20* (2006.01)
(52) U.S. Cl. .............................. 438/478; 257/E21.101; 257/E21.219
(58) Field of Classification Search .......... 257/E21.101, 257/E21.219; 438/507, 504, 478, 424, 485, 438/641, 677
See application file for complete search history.

(56) References Cited

U.S. PATENT DOCUMENTS

| | | | |
|---|---|---|---|
| 4,058,430 A | 11/1977 | Suntola et al. |
| 4,413,022 A | 11/1983 | Suntola et al. |
| 4,656,021 A | 4/1987 | Tanabe et al. |
| 4,747,367 A | 5/1988 | Posa |
| 4,761,269 A | 8/1988 | Conger et al. |
| 5,071,670 A | 12/1991 | Kelly |
| 5,112,439 A | 5/1992 | Reisman et al. |
| 5,194,398 A | 3/1993 | Miyachi et al. |
| 5,221,556 A | 6/1993 | Hawkins et al. |
| 5,306,666 A | 4/1994 | Izumi |
| 5,674,781 A | 10/1997 | Huang et al. |
| 5,711,811 A | 1/1998 | Suntola et al. |
| 5,769,950 A | 6/1998 | Takasu et al. |
| 5,831,335 A | 11/1998 | Miyamoto |

(Continued)

FOREIGN PATENT DOCUMENTS

DE     19820147 A1     7/1999

(Continued)

OTHER PUBLICATIONS

Abeles et al.; *Amorphous Semiconductor Superlattices*; Physical Review Letters; Nov. 21, 1983; pp. 2003-2006; vol. 51; No. 21.

(Continued)

*Primary Examiner*—Thomas L Dickey
*Assistant Examiner*—Nikolay Yushin
(74) *Attorney, Agent, or Firm*—Knobbe Martens Olson & Bear LLP (57) ABSTRACT

Methods and apparatuses for selective epitaxial formation of films separately inject reactive species into a CVD chamber. The methods are particularly useful for selective deposition using volatile combinations of precursors and etchants. Formation processes include simultaneous supply of precursors and etchants for selective deposition, or sequential supply for cyclical blanket deposition and selective etching. In either case, precursors and etchants are provided along separate flow paths that intersect in the relatively open reaction space, rather than in more confined upstream locations.

13 Claims, 5 Drawing Sheets

U.S. PATENT DOCUMENTS

| | | | |
|---|---|---|---|
| 5,851,589 | A | 12/1998 | Nakayama et al. |
| 5,879,459 | A | 3/1999 | Gadgil et al. |
| 5,904,565 | A | 5/1999 | Nguyen et al. |
| 5,916,365 | A | 6/1999 | Sherman |
| 5,933,761 | A | 8/1999 | Lee |
| 6,013,155 | A | 1/2000 | McMillin et al. |
| 6,015,590 | A | 1/2000 | Suntola et al. |
| 6,037,258 | A | 3/2000 | Liu et al. |
| 6,042,654 | A | 3/2000 | Comita et al. |
| 6,048,790 | A | 4/2000 | Iacoponi et al. |
| 6,069,068 | A | 5/2000 | Rathore et al. |
| 6,077,775 | A | 6/2000 | Stumborg et al. |
| 6,083,818 | A | 7/2000 | Stumborg et al. |
| 6,093,252 | A | 7/2000 | Wengert et al. |
| 6,093,368 | A | 7/2000 | Chu et al. |
| 6,100,184 | A | 8/2000 | Zhao et al. |
| 6,139,700 | A | 10/2000 | Kang et al. |
| 6,146,517 | A | 11/2000 | Hoinkis |
| 6,148,761 | A | 11/2000 | Majewski et al. |
| 6,162,323 | A | 12/2000 | Koshimizu |
| 6,181,012 | B1 | 1/2001 | Edelstein et al. |
| 6,184,128 | B1 | 2/2001 | Wang et al. |
| 6,188,134 | B1 | 2/2001 | Stumborg et al. |
| 6,200,893 | B1 | 3/2001 | Sneh |
| 6,203,613 | B1 | 3/2001 | Gates et al. |
| 6,207,487 | B1 | 3/2001 | Kim et al. |
| 6,207,567 | B1 | 3/2001 | Wang et al. |
| 6,225,213 | B1 | 5/2001 | Urabe |
| 6,270,572 | B1 | 8/2001 | Kim et al. |
| 6,287,965 | B1 | 9/2001 | Kang et al. |
| 6,291,876 | B1 | 9/2001 | Stumborg et al. |
| 6,303,523 | B2 | 10/2001 | Cheung et al. |
| 6,340,619 | B1 | 1/2002 | Ko |
| 6,342,448 | B1 | 1/2002 | Lin et al. |
| 6,351,039 | B1 | 2/2002 | Jin et al. |
| 6,358,829 | B2 | 3/2002 | Yoon et al. |
| 6,368,954 | B1 | 4/2002 | Lopatin et al. |
| 6,380,065 | B1 | 4/2002 | Komai et al. |
| 6,391,785 | B1 | 5/2002 | Satta et al. |
| 6,399,491 | B2 | 6/2002 | Jeon et al. |
| 6,444,495 | B1 | 9/2002 | Leung et al. |
| 6,482,733 | B2 | 11/2002 | Raaijmakers et al. |
| 6,511,539 | B1 | 1/2003 | Raaijmakers |
| 6,521,048 | B2 | 2/2003 | Miller et al. |
| 6,555,839 | B2 | 4/2003 | Fitzgerald |
| 6,562,140 | B1 | 5/2003 | Bondestam et al. |
| 6,583,015 | B2 | 6/2003 | Fitzgerald et al. |
| 6,583,048 | B1 | 6/2003 | Vincent et al. |
| 6,593,191 | B2 | 7/2003 | Fitzgerald |
| 6,716,713 | B2 | 4/2004 | Todd |
| 6,727,169 | B1 | 4/2004 | Raaijmakers et al. |
| 6,820,570 | B2 | 11/2004 | Kilpela et al. |
| 6,821,825 | B2 | 11/2004 | Todd et al. |
| 6,900,115 | B2 | 5/2005 | Todd |
| 6,958,253 | B2 | 10/2005 | Todd |
| 6,962,859 | B2 | 11/2005 | Todd et al. |
| 6,969,875 | B2 | 11/2005 | Fitzgerald |
| 7,020,981 | B2 | 4/2006 | Shero et al. |
| 7,026,219 | B2 | 4/2006 | Pomarede et al. |
| 7,091,522 | B2 | 8/2006 | Lee et al. |
| 7,132,338 | B2 | 11/2006 | Samoilov et al. |
| 7,166,528 | B2 | 1/2007 | Kim et al. |
| 7,186,630 | B2 | 3/2007 | Todd |
| 7,195,985 | B2 | 3/2007 | Murthy et al. |
| 7,208,362 | B2 | 4/2007 | Chidambaram |
| 7,235,492 | B2 | 6/2007 | Samoilov |
| 7,237,460 | B2 | 7/2007 | Hu |
| 7,273,526 | B2 | 9/2007 | Shinriki et al. |
| 7,307,273 | B2 | 12/2007 | Currie |
| 7,335,545 | B2 | 2/2008 | Currie |
| 2001/0001742 | A1 | 5/2001 | Huang et al. |
| 2001/0034123 | A1 | 10/2001 | Jeon et al. |
| 2002/0023520 | A1 | 2/2002 | Hu |
| 2002/0168868 | A1 | 11/2002 | Todd |
| 2003/0075273 | A1 | 4/2003 | Kilpela et al. |
| 2004/0142558 | A1 | 7/2004 | Granneman |
| 2004/0216665 | A1 | 11/2004 | Soininen et al. |
| 2004/0216668 | A1 | 11/2004 | Lindfors et al. |
| 2004/0224089 | A1 | 11/2004 | Singh et al. |
| 2004/0235295 | A1* | 11/2004 | Dong et al. .................. 438/680 |
| 2004/0262694 | A1 | 12/2004 | Chidambaram |
| 2005/0023520 | A1 | 2/2005 | Lee et al. |
| 2005/0061243 | A1 | 3/2005 | Sarigiannis et al. |
| 2005/0079691 | A1 | 4/2005 | Kim et al. |
| 2005/0079692 | A1 | 4/2005 | Samoilov et al. |
| 2005/0092247 | A1 | 5/2005 | Schmidt et al. |
| 2005/0150454 | A1 | 7/2005 | Li et al. |
| 2005/0250298 | A1 | 11/2005 | Bauer |
| 2006/0011984 | A1 | 1/2006 | Currie |
| 2006/0014366 | A1 | 1/2006 | Currie |
| 2006/0115933 | A1 | 6/2006 | Ye et al. |
| 2006/0115934 | A1* | 6/2006 | Kim et al. .................... 438/149 |
| 2006/0148151 | A1 | 7/2006 | Murthy et al. |
| 2006/0166414 | A1 | 7/2006 | Carlson et al. |
| 2006/0169668 | A1 | 8/2006 | Samoilov |
| 2006/0169669 | A1 | 8/2006 | Zojaji et al. |
| 2006/0205194 | A1 | 9/2006 | Bauer |
| 2006/0216417 | A1 | 9/2006 | Todd et al. |
| 2006/0234504 | A1* | 10/2006 | Bauer et al. .................. 438/674 |
| 2006/0240630 | A1 | 10/2006 | Bauer et al. |
| 2006/0266289 | A1 | 11/2006 | Verghese et al. |
| 2006/0275546 | A1 | 12/2006 | Arena et al. |
| 2006/0289900 | A1 | 12/2006 | Thirupapuliyur et al. |
| 2007/0015374 | A1 | 1/2007 | Granneman |
| 2007/0259112 | A1 | 11/2007 | Ishikawa et al. |
| 2007/0287272 | A1 | 12/2007 | Bauer et al. |
| 2008/0026149 | A1 | 1/2008 | Tomasini et al. |
| 2008/0202416 | A1 | 8/2008 | Provencher et al. |
| 2009/0111246 | A1 | 4/2009 | Bauer et al. |

FOREIGN PATENT DOCUMENTS

| | | | |
|---|---|---|---|
| DE | 10026180 | | 12/2001 |
| EP | 1024201 | * | 2/2000 |
| EP | 1024210 | | 8/2000 |
| WO | WO 96/17107 | | 6/1996 |
| WO | WO 99/41423 | | 8/1999 |
| WO | WO 99/62109 | | 12/1999 |
| WO | WO 00/11721 | | 3/2000 |
| WO | WO 00/13207 | | 3/2000 |
| WO | WO 00/15866 | | 3/2000 |
| WO | WO 00/15881 | | 3/2000 |
| WO | WO 00/16377 | | 3/2000 |
| WO | WO 00/22659 | | 4/2000 |
| WO | WO 00/55895 | | 9/2000 |
| WO | WO 00/75964 A3 | | 12/2000 |
| WO | WO 00/79576 A1 | | 12/2000 |
| WO | WO 01/15220 A1 | | 3/2001 |
| WO | WO 01/36702 A1 | | 5/2001 |
| WO | WO 01/45149 A1 | | 6/2001 |
| WO | WO 01/66832 | | 9/2001 |
| WO | WO 01/78123 A1 | | 10/2001 |
| WO | WO 01/78124 A1 | | 10/2001 |
| WO | WO 01/99166 A1 | | 12/2001 |
| WO | WO 2004/025716 | | 3/2004 |

OTHER PUBLICATIONS

Antonell et al., "Carbon incorporation for strain compensation during solid phase epitaxial recrystallization of SiGe on Si at 500-600° C.", J. Appl. Phys. 79 (10), pp. 7646-7651 (1996).

Aoyama, T., "Si Selective Epitaxial Growth Using Cl2 Pulsed Molecular Flow Method," Thin Solid Films 321 (1998) 256-260, © 1998 Elsevier Science S.A.

Bauer et al., "Si₃H8 based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy*; Semicond Sci. Technol; 1993; 1052-1062; vol. 8.

Düscöet al.; *Deposition of Tin Oxide into Porous Silicon by Atomic Layer Epitaxy*; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; *A High-C Capacitor (20.4 Ff/μm2) with Ultrathin CVD-Ta2O5 Films Deposited on Rugged Poly-Si for High Density DRAMs*; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Horiike et al.; *Filling of Si Oxide into a Deep Trench using Digital CVD Method; Applied Surface Science*; 1990; pp. 168-174; vol. 46.

Hoyt, "Substitutional carbon incorporation and electronic characterization of $Si_{1-y}C_y$/Si and $Si_{1-x-y}Ge_xC_y$/Si heterojunctions", Chapter 3 in "Silicon-Germanium Carbon Alloy", Taylor and Francis (New York, NY), pp. 59-89 (2002).

Jin et al.; *Porous Silica Xerogel Processing and Integration for ULSI Applications*; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; *Deposition of copper films by an alternate supply of CuCl and Zn*; J. Vac. Sci. Technol.; 1997; pp. 2003; vol.-issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kikkawa et al.; *A Quarter-Micrometer Interconnection Technology Using a TiN/Al-Si-Cu/TiN/Al-Si-Cu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.; *Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of Ti AlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-05-951; vol. 5.

Macknight et al., "RTP applications and technology options for the sub-45 nm node", Proceedings, RTP2004 Conference (Portland, OR) (2004).

Martensson et al.; *Atomic layer epitaxy of copper an ab initio investigation of the CuCl/H2 process III. Reaction barriers*; Appl. Surf. Sci.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.

Martensson et al.; *CU(THD)2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.

Min et al.; *Chemical Vapor Deposition of Ti-Si-N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films*; Applied Physics Letters; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Moller; *Copper and Nickel Ultrathin Films on Metal-Oxide Crystal Surfaces* Mater. Soc. Monogr.; 1994; 473-522; 81.

Niinistö et al.; *Synthesis of oxide thin films and overlayers by atomic layer epitaxy for advanced applications*; Materials Science and Engineering; 1996; pp. 23-29; vol. B41.

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

O'Neil et al., "Optimization of process conditions for selective silicon epitaxy using disilane, hydrogen, and chlorine", J. Electrochem. Soc. 144 (9), pp. 3309-3315 (1997).

Osten et al., "Substitutional carbon incorporation in epitaxial $Si_{1-y}C_y$ alloys on Si(001) grown by molecular beam epitaxy", Applied Physics Letters 74 (6), pp. 836-838 (1999).

Osten et al., "Substitutional versus interstitial carbon incorporation during psuedomorphic growth of $Si_{1-y}C_y$ on Si(001)", J. Appl. Phys. 80 (12), pp. 6711-6715 (1996).

Ott et al.; *Modification of Porous Alumina membranes Using Al2O3 Atomic Layer Controlled Deposition*; Chem. Mater.; 1997; pp. 707-714; vol. 9.

PCT Search Report, PCT Application PCT/US2006/003333; Jun. 30, 2006.

PCT Search Report, PCT Application PCT/US2006/003465; Jul. 7, 2006.

PCT Search Report of Aug. 6,2009, Application No. PCT/US2008/080803, filed Oct. 22,2008.

Ritala et al.; *Atomic Layer Epitaxy Growth of TiN Thin Films from TiIa and NH3*; J. Electrochem. Soc.; Aug. 1998; pp. 2914-2920; vol. 145; No. 8.

Ritala et al.; *Controlled Growth of TaN, Ta3N5, and TaOxNy Thin Films by Atomic Layer Deposition*; Chem. Mater.; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition*; ChemVap. Deposition; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999, pp. IITC 99-187-IITC 99-189.

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

Singer; *Atomic Layer Deposition Targets Thin Films*; Semiconductor International; Sep. 1999; pp. 40.

Sneh et al.; *Atomic layer growth of SiO2 on Si(100) using SiCl4 and H2O in a binary reaction sequence*; Surface Science; 1995; pp. 135-152; vol. 334.

Solanki et al.; *Atomic Layer Deposition of Copper Seed Layers*; Electrochem. and Solid State Lett.; 2000; 479-480; 3(10).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained $Si_{1-y}C_y$/Si heterostructures", J. Appl. Phys. 76 (6), pp. 3656-3668 (1994).

Tiitta et al.; *Preparation and Characterization of Phosphorus-Doped Aluminum Oxide Thin Films*; Materials Research Bulletin; 1998; pp. 1315-1323; vol. 33, No. 9.

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang; *Spin on Dielectric Films—A General Overview*; 1998 5th International Conference on Solid-State and Integrated Circuit Technology Proceedings; Oct. 21-23, 1998; p. 961; Beijing, China.

Windl et al., "Theory of strain and electronic structure of $Si_{1-y}C_y$ and $Si_{1-x-y}Ge_xC_y$ alloys", Phys. Rev. B57 (4), pp. 2431-2442 (1998).

Wise et al.; *Diethyldiethoxysilane as a New Precursor for SiO2 Growth on Silicon*; Mat. Res. Soc. Symp. Proc.; 1994; pp. 37-43; vol. 334.

Wolf et al.; *Process and Equipment Simulation of Copper Chemical Vapor Deposition Using Cu(hfac)vtms*; Microelectronic Engineering; 1999; 15-27; 45.

Yagi et al.; *Substitutional C incorporation into Si1-yCy alloys using novel carbon source, 1,3-disilabutane*; Japanese Journal of Applied Physics; 2004; pp. 4153-4154; vol. 43, No. 7A.

\* cited by examiner

SEPARATE INJECTION OF REACTIVE SPECIES IN SELECTIVE FORMATION OF FILMS

CROSS-REFERENCE TO RELATED APPLICATIONS

This application is a divisional of U.S. patent application Ser. No. 11/963,627, filed Dec. 21, 2007, the disclosure of which is hereby incorporated by reference in its entirety herein.

BACKGROUND OF THE INVENTION

1. Field of the Invention

This application relates generally to semiconductor processing. More particularly, this application relates to the selective deposition of films and equipment configured for the same.

2. Description of the Related Art

As is well known, semiconductor processing is most commonly employed for the fabrication of integrated circuits, which entails particularly stringent quality demands, but such processing is also employed in a variety of other fields. For example, semiconductor processing techniques are often employed in the fabrication of flat panel displays using a wide variety of technologies and in the fabrication of microelectromechanical systems (MEMS).

A variety of methods are used in the semiconductor manufacturing industry to deposit materials onto surfaces. For example, one of the most widely used methods is chemical vapor deposition ("CVD"), in which atoms or molecules contained in a vapor deposit on a surface and build up to form a film. In some contexts, it is desirable to deposit selectively within semiconductor windows exposed among fields of different materials, such as field isolation oxide. For example, heterojunction bipolar transistors are often fabricated using selective deposition techniques that deposit epitaxial (single-crystal) semiconductor films only on active areas. Other transistor designs benefit from elevated source/drain structures, which provide additional silicon that can be consumed by the source/drain contact process without altering shallow junction device performance. Selective epitaxy on source/drain regions advantageously reduces the need for subsequent patterning and etch steps.

Generally speaking, selectivity takes advantage of differential nucleation and/or formation of different crystal morphology during deposition on disparate materials. Selective deposition can generally be explained by simultaneous etching and deposition of the material being deposited. The precursor of choice will generally have a tendency to nucleate and grow more rapidly on one surface and less rapidly on another surface. For example, silane will generally nucleate on both silicon oxide and silicon, but there is a longer nucleation phase on silicon oxide. At the beginning of a nucleation stage, discontinuous films on oxide have a high exposed surface area relative to merged, continuous films on silicon. Similarly, the growth on the insulating regions can be amorphous or polycrystalline whereas growth on the semiconductor windows can be epitaxial. Accordingly, an etchant added to the process will have a greater effect upon the poorly nucleating film on the oxide as compared to the more rapidly nucleating film on the silicon. Similarly, an etchant can be more effective against amorphous or polycrystalline growth, whether from a prior deposition or during deposition, than against epitaxial growth. The relative selectivity of a process can thus be tuned by adjusting factors that affect the deposition rate, such as precursor flow rates, temperature, pressure, and factors that affect the rate of etching, such as e.g., etchant flow rate, temperature, pressure. Changes in each variable will generally have different effects upon etch rate and deposition rate. Typically, a selective deposition process is tuned to produce the highest deposition rate feasible on the window of interest while accomplishing no deposition in the field regions.

Known selective silicon deposition processes include reactants such as silane and hydrochloric acid with a hydrogen carrier gas. Co-owned and co-pending U.S. patent application Ser. No. 11/343,264, entitled "SELECTIVE DEPOSITION OF SILICON-CONTAINING FILMS," published as U.S. 2006/0234504 A1 on Oct. 19, 2006, teaches processes that employ trisilane as a silicon source and chlorine gas as an etchant. These selective deposition processes show improved uniformity, purity, deposition speed and repeatability. However, strong exothermic reactions have been observed, potentially leading to premature reactant breakdown, damage to the gas intermixing tank, combustion, and substrate contamination. Other selective deposition chemistries are also subject to excessive reactivity. Accordingly, reaction apparatuses and selective deposition processes are desired that avoid such adverse effects while maintaining their efficacy for selective deposition.

SUMMARY OF THE INVENTION

Processes and equipment for selectively forming layers have now been discovered that minimize risk of violent reaction between precursors and etchant source chemicals. The described processes and equipment supply the reactive species to the reaction chamber separately rather than along common flow paths upstream of the reaction chamber. These processes and equipment avoid undesired heat formation and premature deposition, and reduce the risk of damage to expensive gas panel units. Separate flow paths to the chamber can avoid premature and harmful reactions for simultaneous precursor/etchant supply or for sequential supply of precursors and etchants.

One embodiment provides a method for selectively forming a semiconductor layer on a substrate in a reaction space, where the substrate includes a first surface and a second surface. The method includes separately introducing a precursor for semiconductor deposition and a vapor etchant through separate flow paths into the reaction space. The substrate is exposed to the precursor and to the vapor etchant. The method further includes selectively forming the semiconductor layer on the first surface at a greater mean rate than on the second surface.

Another embodiment provides an apparatus for selectively forming a semiconductor film on a substrate. The apparatus includes a chemical vapor deposition (CVD) reactor that includes a reaction space. A substrate support is positioned within the reaction space and the substrate support is sized and shaped to receive a silicon wafer. A first inlet set of one or more inlets is in fluid communication with the reaction space and a second inlet set of one or more inlets is in fluid communication with the reaction space. A first gas source is configured to supply a precursor for semiconductor deposition to the first inlet set. A second gas source is configured to supply an etchant to the second inlet set. The inlet sets and sources define separate flow paths for the precursor and the etchant to a mixing space within the reaction space.

Another embodiment provides an apparatus including a chemical vapor deposition (CVD) reactor that includes a reaction space. A substrate support is positioned within the reaction space. A first inlet set of one or more inlets is in fluid communication with the reaction space, wherein the first inlet set comprises a manifold configured to spread a precursor for semiconductor deposition across a width of the reaction space via a plurality of inlets. A second inlet set of one or more inlets is in fluid communication with the reaction space. A first gas source is configured to supply the precursor to the first inlet set and a second gas source is configured to supply an etchant to the second inlet set. The inlet sets and sources define separate flow paths for the precursor and the etchant to a mixing space within the reaction space. These and other embodiments are described in greater detail below.

BRIEF DESCRIPTION OF THE DRAWINGS

These and other aspects of the invention will be readily apparent from the following description and from the appended drawings (not to scale), which are meant to illustrate and not to limit the invention, and in which.

DETAILED DESCRIPTION OF THE EMBODIMENTS

In many selective deposition processes, Si-containing layers are selectively formed over single crystal semiconductor materials while minimizing and more preferably avoiding deposition over adjacent dielectrics. Examples of dielectric materials include silicon dioxide (including low dielectric constant forms such as carbon-doped or fluorine-doped), silicon nitride, metal oxide and metal silicate. More generally, patterned or mixed substrates have two or more different types of surfaces. There are various ways that the surfaces of a mixed substrate can be different from each other. For example, the surfaces can have different material compositions, different crystal morphologies and/or different electrical properties.

Even if the materials are made from the same composition, surfaces can be different if the morphologies, i.e., the crystallinity of the surfaces, are different. The processes described herein are useful for depositing Si-containing films on a variety of substrates, but are particularly useful for mixed substrates having mixed surface morphologies. A mixed substrate with a mixed surface morphology is a substrate that includes a first surface having a first surface crystal structure and a second, different surface crystal structure. Amorphous, polycrystalline and single crystal are examples of different morphologies.

Epitaxial deposition refers to the deposition of a crystalline semiconductor material onto a crystalline substrate in such a way that the deposited layer adopts or follows the lattice constant of the substrate. Epitaxial deposition may be homoepitaxial or heteroepitaxial. Homoepitaxial deposition occurs when the deposited layer is formed of the same material as that of the substrate, such as epitaxially depositing a layer of silicon on a single-crystal silicon substrate. Heteroepitaxial deposition occurs when the composition of the deposited layer differs from that of the substrate, such as when epitaxially depositing germanium or silicon germanium on a single-crystal silicon substrate.

Epitaxial films are characterized by a crystal structure and orientation that is identical to the substrate upon which they are grown. Typically, the substrate is a single crystal, such that the epitaxial film is also a single crystal. The atoms in these materials are arranged in a consistent lattice-like structure that persists over relatively long distances on an atomic scale. By contrast, amorphous morphology is a non-crystalline structure having a low degree of order because the atoms lack a definite repetitive arrangement. Other morphologies include microcrystalline and mixtures of amorphous and crystalline material. As used herein, a "single-crystal" structure is implied by epitaxial deposition and is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. The skilled artisan will understand that methods described herein for depositing Si-containing films onto mixed or patterned substrates having two types of surfaces may also be applied to mixed substrates having three or more different types of surfaces.

Figure 1:
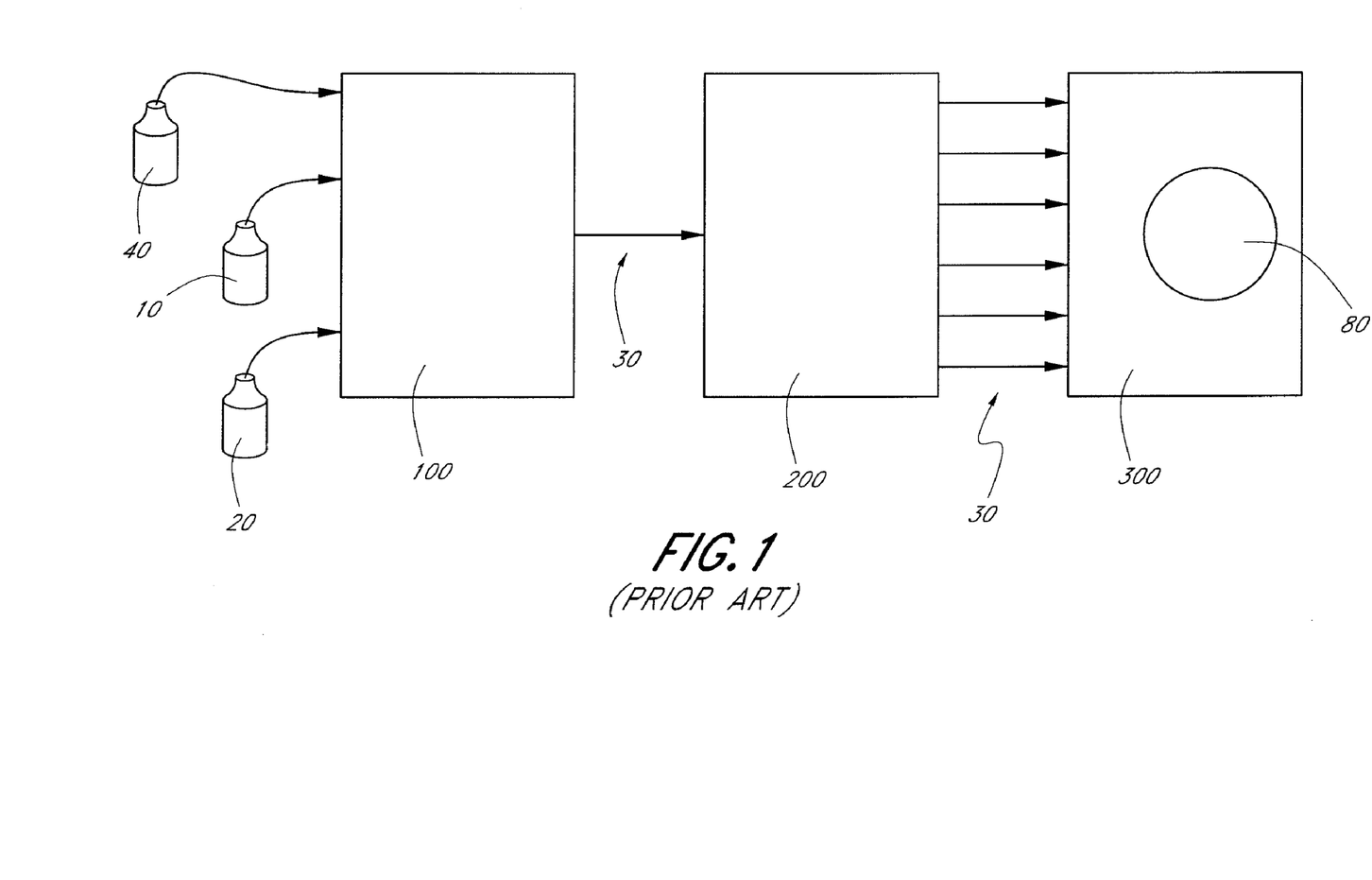
FIG. 1 shows a known apparatus for chemical vapor deposition (CVD) on a substrate.

FIG. 1 illustrates a conventional system for chemical vapor deposition (CVD) on a substrate 80. "Substrate," as that term is used herein, refers either to the workpiece upon which deposition is desired, or the surface exposed to reactant gases. For example, the substrate 80 may be a single crystal silicon wafer, or may be a semiconductor-on-insulator (SOI) substrate, or may be an epitaxial Si, SiGe or III-V material previously formed upon such wafers. Wafers include substantially flat substrates, such as those having diameters of 200 mm, 300 mm, and 450 mm. Substrates are not limited to wafers, but also include glass, plastic, or any other substrate employed in semiconductor processing. Gases, including vapors from a first reactant source 10 and a second reactant source 20, are supplied to a gas panel 100. Inert gases from an inert gas source 40 are typically also added to aid in the chemical vapor deposition process.

It is conventional to mix the reactive gases 10, 20 upstream of the reaction chamber 300 because a well-mixed, homogenous mixture or feed gas 30 with a uniform concentration of reactants can facilitate uniform deposition on the substrate 80 once the feed gas 30 reaches the reaction chamber 300. Thus, for a single-pass, laminar, horizontal flow single wafer reactor, it is conventional to intermix the reactive gases from the reactant sources 10, 20 at the gas panel 100 to promote uniform deposition on the substrate 80 in the reaction chamber 300. Once the gases from the sources 10, 20, 40 have been intermixed in the gas panel 100, the feed gas 30 is delivered to an inlet distribution manifold 200. The manifold 200 serves to distribute the flow of the feed gas 30 across the width of the reaction chamber 300. The manifold 200 may be configured to distribute flow in such a way to enhance uniformity of the semiconductor deposition on the substrate 80 in the reaction chamber 300. Typically, the delivery of the feed gas 30 from the gas panel 100 to the inlet distribution manifold 200 is accomplished through pipes or tubes with cross-sectional areas that are substantially smaller than that of the gas panel 100. Such pipes or tubes may include valves to regulate the flow of the feed gas 30. Further, within the manifold 200, the feed gas 30 may pass through other piping that restricts the flow of the feed gas 30 into the reaction chamber 300. Thus, the feed gas 30 will typically pass through one or several bottlenecks or flow restrictions within and downstream of the gas panel 100, after the gases from the reactant sources 10, 20 have been intermixed.

Selective formation processes using a precursor for semiconductor deposition from the first reactant source 10 and an etchant from the second reactant source 20 show excellent selectivity and deposition speed. Generally, selective deposition processes result in net deposition rates over semiconductor areas being greater than 5 times, and preferably greater than 10 times, rates of deposition over insulators and windows. Fully selective processes result in no net deposition over insulators or metals. Net deposition rates are calculated over the entire process, whether simultaneously or sequentially providing precursors and etchants. However, some of these processes have shown strong exothermic reactions when the precursor for semiconductor deposition and etchant gas intermix. Precursors for CVD of semiconductors can be selected from the group of silicon precursors, germanium precursors and carbon precursors. Silicon precursors may include trisilane ($Si_3H_8$), dichlorosilane ($H_2SiCl_2$, "DCS"), disilane ($Si_2H_6$), partially chlorinated disilane, methyl silane, silane ($SiH_4$) or 2,2-dichlorotrisilane. Germanium precursors include germane, digermane and trigermane. Carbon precursors include silylalkanes such as monosilylmethane, disilylmethane, trisilylmethane and tetrasilylmethane, and/or alkyl-silanes such as monomethyl silane (MMS), and dimethyl silane. In some embodiments, a carbon precursor comprises $H_3Si-CH_2-SiH_2-CH_3$ (1,3-disilabutane) or $CCl_2(SiH_3)_2$ (2,2-dichlorodisylilmethane). Etchant sources include chlorine gas ($Cl_2$).

Taking trisilane and chlorine gas as an example, it is believed that at high enough partial pressures, $Cl_2$ reacts with Si to produce silicon tetrachloride ($SiCl_4$) in an exothermic reaction. The highly exothermic hypergolic reaction of $Cl_2$ with $Si_3H_8$ can lead to combustion of the silicon precursor. The reaction can occur upstream the reaction chamber 300 and therefore lead to premature silicon deposition, which can also lead to subsequent spalling or aerosol particle formation and contamination. In addition, the powerful exothermic reactions can damage the equipment at the point of interaction, such as expensive gas panel units 100. Similar issues can arise with other combinations of semiconductor precursors and etchant gases. Without being limited by theory, it is believed that interaction among the reactant gases in a limited volume and/or passing the reactant gases along common or shared flow paths through flow restrictions prior to entry into the reaction chamber 300 may contribute to these problems. Interaction between highly reactive precursors and etchants under the high pressures caused by these restrictions in a very confined flow path might cause the highly energetic and even explosive reactions that have been observed. Damage is greater in confined passages, and may exacerbate reactivity by inhibiting heat dissipation, relative to wider, more voluminous spaces. Note that such interaction can occur within these tight confines whether the reactants are supplied simultaneously or sequentially. In sequential supply, residual reactants from a first pulse inevitably remain within the shared flow path when the next pulsed is supplied, which can then react in the shared flow path upstream of the chamber.

Embodiments taught herein avoid undesired effects of highly reactive combinations of a semiconductor precursor and an etchant species in selective formation processes by separately injecting the reactive species into the reaction chamber 300. Particularly volatile combinations of precursor and etchant produce reactions that are at least as exothermic as the reaction of DCS+$Cl_2$. Several highly reactive combinations include without limitation pentasilane+$Cl_2$; tetrasilane+$Cl_2$; trisilane+$Cl_2$; disilane+$Cl_2$; and partially chlorinated disilane+$Cl_2$. FIG. 6 compares the exothermicity of several exemplary combinations of silicon precursors and etchants. The table below compares exothermicity, in terms of approximate enthalpy values, for certain silicon precursors when combined with $Cl_2$.

| Silicon Precursor | Enthalpy at 0° C. (kcal/mol) | Enthalpy at 550° C. (kcal/mol) |
|---|---|---|
| Trisilane | −450 | −550 |
| Silane | −500 | −500 |
| Disilane | −460 | −460 |
| Monochlorodisilane | −400 | −380 |
| Dichlorodisilane | −340 | −320 |
| Trichlorodisilane | −270 | −250 |
| Dichlorosilane | −270 | −250 |
| Tetrachlorodisilane | −220 | −200 |
| Pentachlorodisilane | −150 | −130 |

While much of the description herein focuses on the exemplary combination of trisilane+$Cl_2$, the skilled artisan will readily appreciate from the disclosure herein that the described equipment will also benefit process recipes employing other highly reactive combinations, particularly those more exothermic than DCS+$Cl_2$, at the reaction temperature (e.g., more exothermic than −270 kcal/mol at 0° C. or −250 kcal/mol at 550° C.).

Without limiting the invention by theory, it is believed that embodiments of the present invention minimize the risk of premature reactant breakdown, combustion, damage to equipment and substrate contamination by providing separate flow paths for precursors and etchants, thereby avoiding their interaction under high pressure in a limited volume at the gas panel 100 or between the gas panel 100 and the reaction chamber 300. Moreover, the reactivity of the gases can be further minimized by supplying an increased amount of carrier gas and thereby reducing the partial pressure of the reactants, shortening the residence time of the gases, increasing the velocity of the gases and/or improving the heat capacity of the gases. Because the gases avoid interaction in high pressure regions that could trigger or exacerbate upstream reactions, intermediate reactive species (e.g., SiHCl, $SiH_2$ and $Si_2H_4$ for $Si_3H_8$+$Cl_2$ reactants) can reach the substrate 80 rather than having the reaction completed prematurely. Additionally, the risk of damaging the expensive equipment is reduced.

Figure 2:
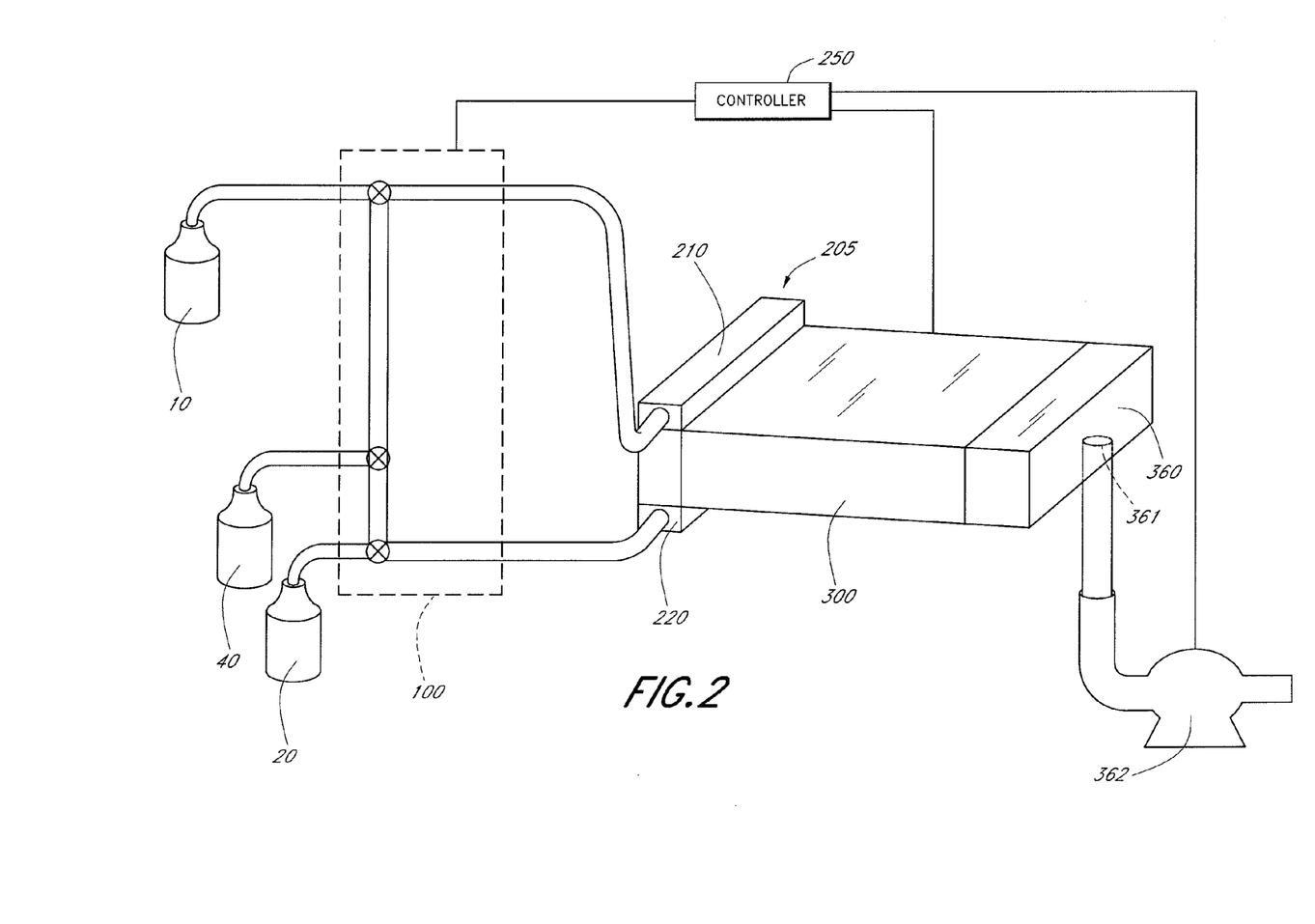
FIG. 2 is a schematic diagram of a CVD system in accordance with an embodiment.

A schematic diagram of a selective deposition system in accordance with an embodiment of the present invention is shown in FIG. 2. In an embodiment, the CVD reaction chamber 300 can be a single wafer reactor, particularly a horizontal gas flow CVD chamber. In some embodiments, the reaction chamber 300 is a cold wall, radiantly heated, single-wafer, single pass, laminar horizontal gas flow reactor. Suitable reactors of this type are commercially available, including the Epsilon™ series of single-wafer reactors commercially available from ASM America, Inc. of Phoenix, Ariz. The reaction chamber 300 of the illustrated embodiment (see FIG. 3) includes a rotating substrate, and permits low process gas residence times. CVD may be conducted by introducing plasma products to the chamber, either in situ or downstream of a remote plasma generator. Alternatively, thermal CVD can be used.

As illustrated in FIG. 2, a first reactant source 10 and a second reactant source 20 are in fluid communication with a gas panel 100. The first and second reactant sources 10, 20 are chosen to promote selective formation of semiconductor films on the substrate. As explained above, selective deposition means that a film, such as silicon, is deposited on a first portion of the surface of the substrate at a greater mean rate than on a second portion of the same surface. In some selective deposition embodiments, the rate of semiconductor deposition on the second portion may be approximately the same rate at which silicon is etched away, resulting in an effective deposition rate of zero on the second portion. Cyclical deposition and etching can have the same effect.

In an embodiment, the first reactant source 10 contains a silicon precursor, such as a precursor selected from the group consisting of pentasilane, tetrasilane, trisilane, DCS, disilane, partially chlorinated disilane, methyl silane and silane. In other embodiments, the first reactant source 10 contains a carbon precursor. In other embodiments, the first reactant source 10 contains a germanium precursor. The first reactant source 10 can represent multiple reactant vessels, such as for deposition of SiGe, Si:C or SiGe:C. The second reactant source 20 can contain a halogen-containing etchant to provide selectivity to the deposition process. Embodiments can employ a chlorine-containing species, such as diatomic chlorine gas ($Cl_2$), in the second reactant source 20. Employing diatomic chlorine as an etchant can provide superior etch capability even at low temperatures in the range of 400° C. and 600° C., but can be highly reactive in combination with precursors for semiconductor deposition. As noted above, processes taught herein provide particular advantages when the combination of the first reactant source 10 and the second reactant source 20 is a highly reactive combination that produces exothermic reactions.

An inert gas source 40 may also communicate with a gas panel 100 as a purge gas and/or carrier gas for either the first reactant source 10 or the second reactant source 20. Among other roles, the inert gas source 40 can provide backpressure for the reactants at their inlets to the chamber 300, thus preventing gas from the first reactant source 10 from diffusing into a second inlet manifold 220 and vice versa, whether for simultaneous or sequential supply of precursors and etchants. The inert gas source 40 can also remove heat due to its heat capacity, thereby lowering the temperature of the reactants. Further, the inert gas source 40 can dilute gas from the first and second reactant sources 10, 20 (i.e., reduce the concentration of the reactants), thereby slowing the reaction and aiding stable, slow decomposition of the precursors where desired. This, in turn, yields favorable precursor utilization and high growth rates for the film, as well as a lower temperature in the reaction chamber 300. In order to minimize exothermic reactions, in some embodiments the inert gas source 40 includes helium (He), argon (Ar), nitrogen ($N_2$), xenon (Xe), krypton (Kr), neon (Ne), hydrogen chloride (HCl) or other gases that are nonreactive under deposition conditions. The carrier gas may further include inhibitors such as those disclosed in co-owned and co-pending U.S. patent application Ser. No. 11/925,518, entitled "INHIBITORS FOR SELECTIVE DEPOSITION OF SILICON CONTAINING FILMS," which is hereby incorporated by reference for its description of suitable inhibitor agents for decelerating reactions between silicon precursors and chlorine-containing etchants. Examples include propylene, butadiene, benzene, naphthalene, phenanthrene, anthracene, cycloheptatrienecation, cyclohelptatrien, furan, pyridine, pyrrole and thiophene. Because of the ability of the inert gas source 40 to dilute and lower the temperature of the first and second reactant sources 10, 20 and thus inhibit the reaction, relatively higher flow rates of gas from the inert gas source 40 may be supplied for relatively more reactive combinations of the first and second reactant sources 10, 20. For example, in embodiments employing trisilane and chlorine gas, which is a very highly reactive combination, the gas from inert gas source 40 may have a flow rate between about 10 and 40 slm.

The gas panel 100 may include valves, mass flow controllers (MFCs), and other control elements that allow the operator to balance various parameters to optimize deposition in the reaction chamber 300. Such parameters include, but are not limited to, flow rates, temperatures, and total pressures for vapors from the inert gas source 40, first reactant source 10, and second reactant source 20, as well as molar ratio between the precursor for semiconductor deposition of the first reactant source 10 and the chlorine-containing species of the second reactant source 20. In embodiments in which trisilane is employed as the first reactant source 10 simultaneously with the second reactant source 20, the molar ratio between the trisilane and the chlorine-containing species may be between about 1:3 and 1:12, particularly between about 1:5 and 1:10. To moderate reactivity, flow rates for trisilane can be less than about 100 milligrams per minute, particularly less than about 50 milligrams per minute, more particularly less than about 25 milligrams per minute.

Significantly, while the inert gas source 40 may be combined with either the first reactant source 10 or the second reactant source 20 or both, embodiments prevent interaction of the vapor phase reactants from the first reactant source 10 and the second reactant source 20 in the gas panel 100. Instead, the flow paths of gas from the first reactant source 10 and gas from the second reactant source 20 intersect for the first time only at a mixing point or space within the reaction chamber 300. Suitable gas panels are commercially available, such as the E2000™, E2500™, E3000™, E3200™ and E3220™ from ASM America, Inc. of Phoenix, Ariz.

Referring still to FIG. 2, gases or vapors from the reactant sources 10, 20 communicate with the reaction chamber by way of an inlet flange 205. In particular, vapor from the gas panel 100, from the first reactant source 10 flows to a first inlet manifold 210 of the inlet flange 205, while vapor from the second reactant source 20 flows separately to a second inlet manifold 220 of the inlet flange 205. The inlet manifolds 210, 220 are configured to distribute gas across the width of a reaction space 340 defined in part by the reaction chamber 300. An exhaust flange 360 on a downstream end of the reaction chamber 300 comprises an exhaust outlet 361, which is configured to evacuate excess reactant vapors and reaction by-product from the reaction space 340. This process may be effectuated by means of a pump 362 communicating with the exhaust outlet 361.

Figure 3:
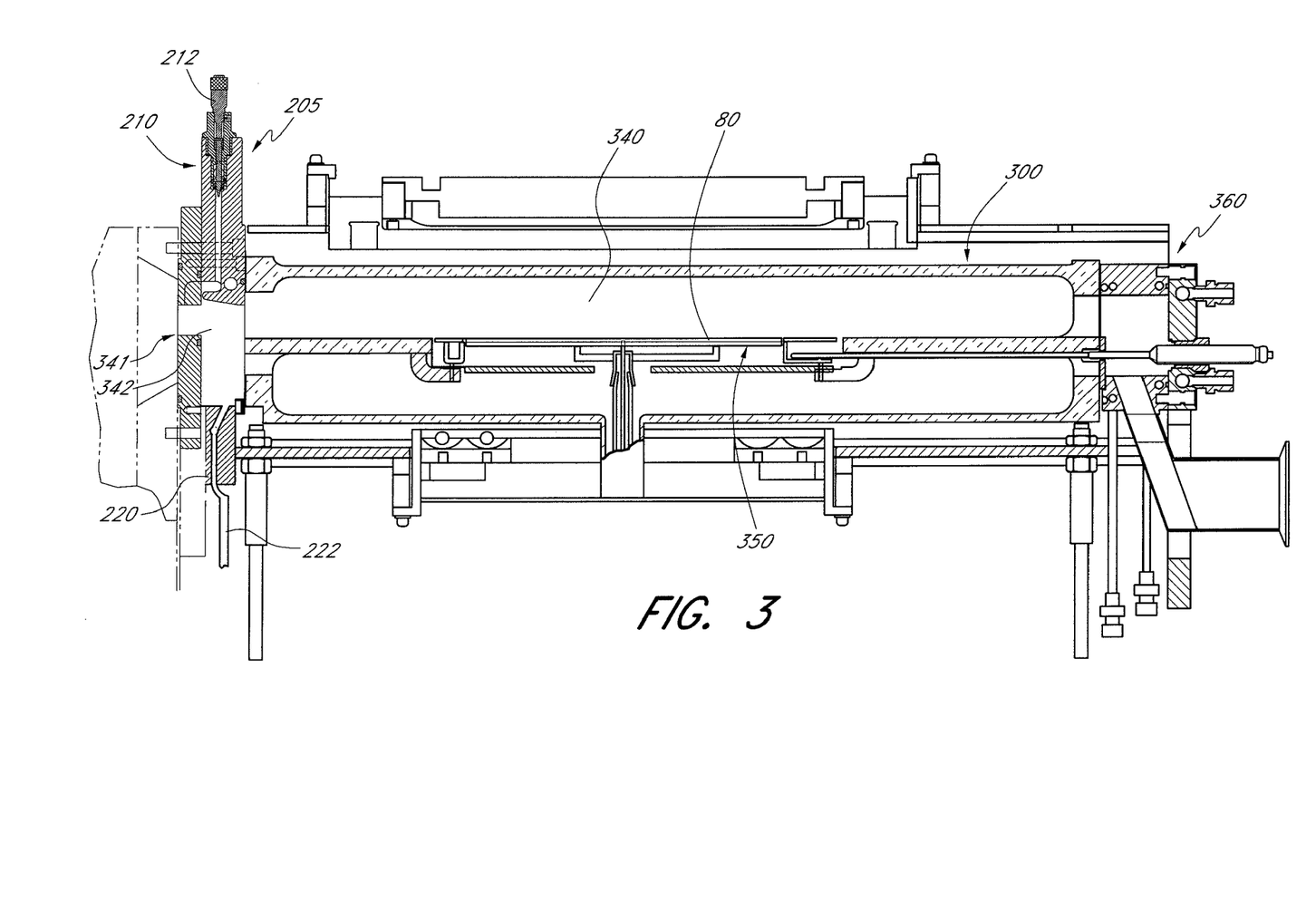
FIG. 3 is a cross-sectional side view of a CVD system in accordance with an embodiment.

FIG. 3 is a schematic cross-section illustrating the reaction space 340. The reaction space 340, as described herein, includes the space defined by the quartz walls of the reaction chamber 300 in addition to an upstream wafer insertion opening of the inlet flange 205, though which wafers are loaded and unloaded. The precursor and etchant flow paths are kept separate through the first and second inlet manifolds 210, 220 and intersect for the first time at a mixing space 342 within the wafer insertion opening 341. From the mixing point 342, the precursor and etchant follow a shared or common flow path over a substrate support 350, which is sized and shaped to support the substrate 80. Excess reactants and by-products continue along the laminar, horizontal, common flow path to the exhaust flange 360.

Figure 4:
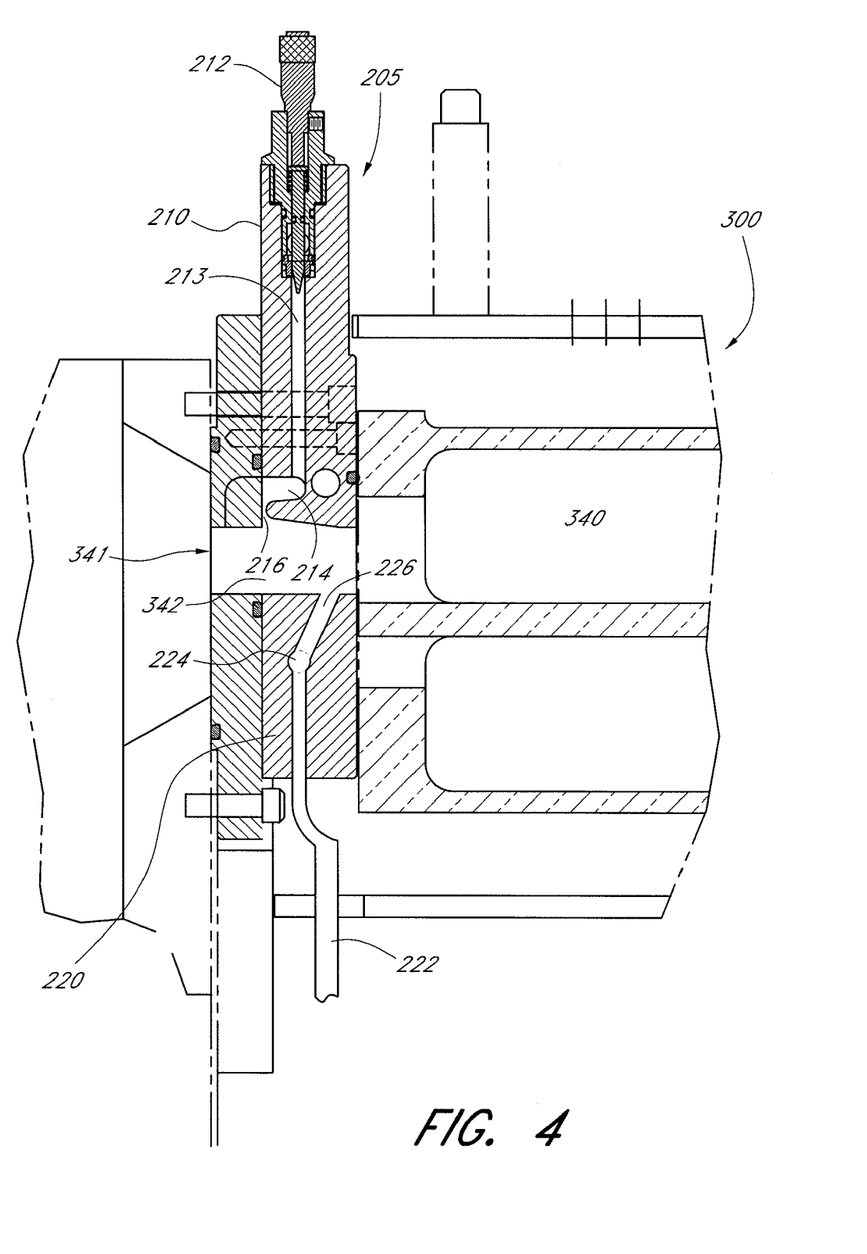
FIG. 4 is a detailed view of the CVD system shown in FIG. 3.
Figure 5:
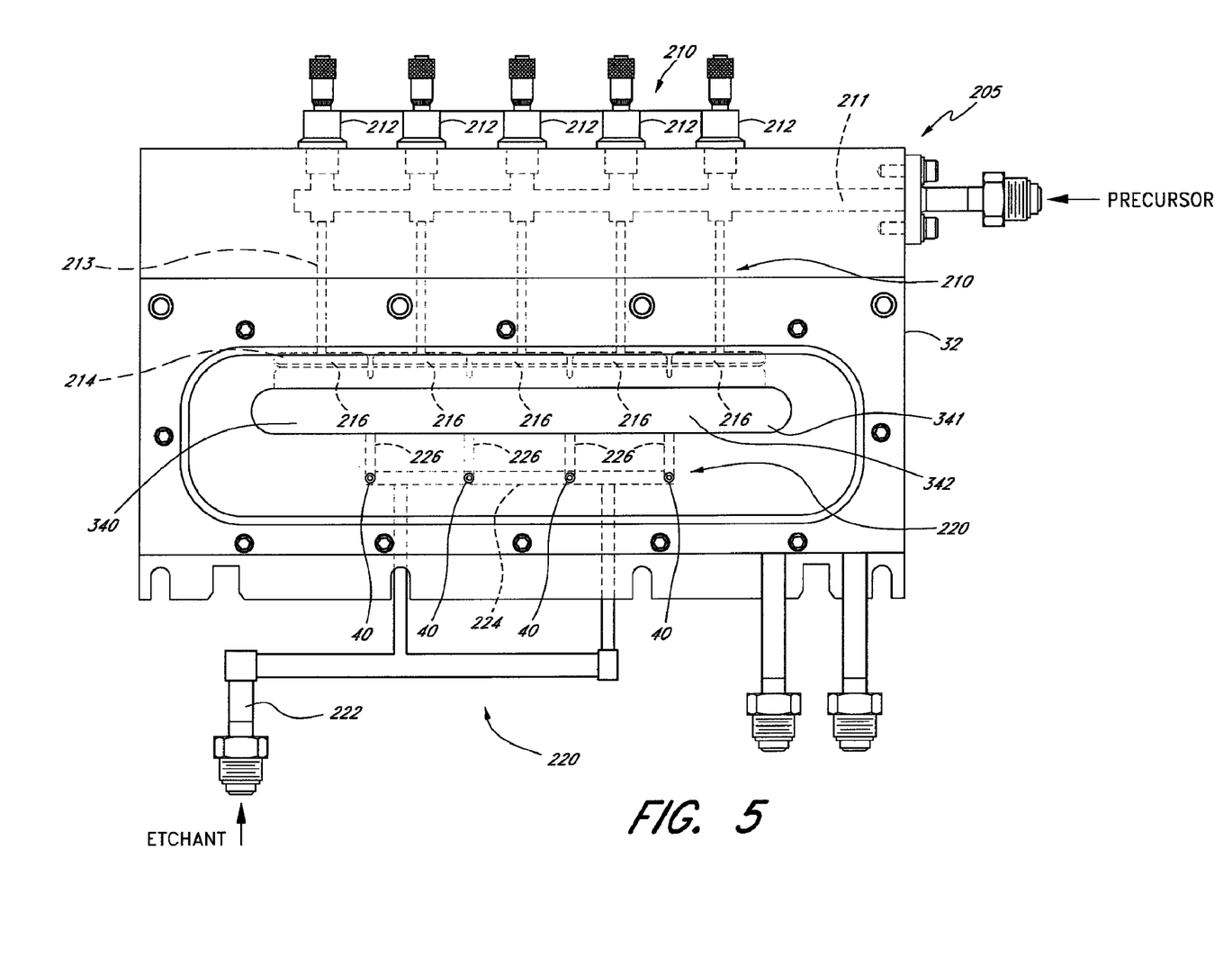
FIG. 5 is a cross-sectional front view of a CVD system in accordance with an embodiment.

As shown in FIGS. 3-5, the first or upper inlet manifold 210 may include several injectors 212 that control relative flow into a reaction space 340 within the reaction chamber 300.

Specifically, gas from the first reactant source 10 enters a channel 211 (see FIG. 5) in communication with each of the injectors 212. Each of the injectors 212 controls a flow path from the channel 211 through an associated entrance tube 213. Each entrance tube 213 leads into a horizontal channel 214, which traverses a portion of the width of a reaction space 340. From the channel 214, gases flow into the reaction space 340 via slits 216. The slit 216 has a smaller cross-sectional area, transverse to the gas flow path, than the channel 214 and is therefore a bottleneck or flow constriction on gases from the first reactant source 10, aiding in spreading the gases across the portion of the width of the reaction space 340 that the slit 216 traverses. FIGS. 3-5 illustrate one embodiment of the first inlet manifold 210, but other configurations can alternatively be employed to distribute gas across the width of the reaction chamber 300. For example, gas from the first reactant source 10 may flow into the reaction space 340 directly from a single channel or from a single slit that traverses all or a substantial portion of the width of the reaction space 340, rather than from multiple slits 216 as shown. Thus, the first inlet manifold 210 can define multiple inlets to the reaction space 340, as shown, or a single inlet.

With respect to the second or lower inlet manifold 220, gas from the second reactant source 20 supplied by the supply line 222 flows into a lower horizontal channel 224, which traverses all or a portion of the width of the reaction space 340 in order to more evenly distribute gas. From the lower channel 224, gases flow into the reaction space 340 via a plurality of lower entrance tubes 226. As shown in FIGS. 4-5, the plurality of lower entrance tubes 226 comprise discrete passages distributed across the width of the reaction space 340. In the illustrated embodiment, the lower entrance tubes 226 are positioned on an opposite wall, across from and between the slits 216 of the first inlet manifold 210 in order to facilitate uniform mixing of the gases upon entry into the reaction space 340 for operation of simultaneous supply modes of operation. Even for sequential supply modes, the illustrated arrangement of alternation of the upper and lower inlets, represented by the slits 216 and lower entrance tubes, respectively, can aid spreading the reactants supplied therethrough by mixing insert gas from one of the inlets sets when reactant flows from the other of the inlet sets. In an alternative embodiment not shown in the figures, vapor from the second reactant source can enter the reaction space 340 via a single slit or a plurality of slits with a width that traverses all or a substantial portion of the width of the reaction space 340 such that the inlet(s) of the second inlet manifold 220 can resemble the inlets or slits 216 of the first inlet manifold 210. Gas from the supply line 222 is provided with sufficient backpressure to prevent gas from the first reactant source 10 from diffusing into the inlets 226 in either simultaneous or sequential supply modes of operation.

As such, gas from the first reactant source 10 has the potential to interact with gas from the second reactant source 20 at a mixing space 342 in the reaction space 340. The mixing space 342 thus represents the first intersection between the flow paths of reactants from the first reactant source 10 and the second reactant source 20.

In some modes of operation, gas from the first reactant source 10 and gas from the second reactant source 20 are introduced sequentially into the reaction space 340 such that the reactants from the reactant sources 10, 20 are not intended to mix during processing. The illustrated separate flow paths still reduces the risk of explosive interaction between reactants for such sequential modes of operation. Because the illustrated inlet flange 205 keeps the flow paths for the reactants separate until they intersect at the mixing space 342, there is no danger that residual reactant from one pulse will interact with a subsequent pulse of the other reactant within the confines of the gas panel 100 (FIG. 2) or the inlet manifolds 210, 220. The disclosure of co-owned and copending U.S. Patent Application Publication No. 2007/0287272, published Dec. 13, 2007, is incorporated by reference herein for the purposes of describing exemplary processes in which selective formation of semiconductor films is accomplished by supplying deposition precursors and etchants sequentially, rather than simultaneously. The sequential and preferably cyclical process of the '463 patent application provides for blanket deposition over insulating and single-crystal silicon surfaces of a patterned or mixed substrate, followed by selective etching of non-epitaxial material. The blanket deposition is conducted in the absence of etchant, or with low enough levels of etchant as to result in significant net deposition on all surfaces. Epitaxial semiconductor material is left on single crystal semiconductor windows of the patterned substrate, while nonepitaxial material is left on other surfaces, such as metals on insulators. Nonepitaxial (e.g., amorphous or poly) semiconductor material is more susceptible to etching, and the subsequent etchant pulse is timed to remove all non-epitaxial material from the deposition while leaving at least some of the epitaxial material from the deposition.

In other modes of operation, the gases are introduced simultaneously into the reaction space 340 and actually mix and interact during selective deposition. As the precursors and etchants mix within the reaction space, under lower pressures and in a larger volume than the upstream gas panel 100 (FIG. 2) and inlet manifolds 210, 220, there is less risk of damage to equipment from violent reactions. Preferably conditions are selected to maintain 100% selectivity, for example, zero net deposition over insulating surfaces and some net epitaxial deposition over single crystal semiconductor windows.

Referring back to FIG. 2, the above-described simultaneous and sequential modes of operation can be implemented by instructions or programming of a controller 250. The controller 250, which can include a general purpose or special purpose computer, communicates with devices on the gas panel 100, such as valves and mass flow controllers, as well as flow control devices at other locations. For example, one or more of the sources 10, 20 can have control valves and heaters in communication with the controller 250. The controller 250 also adjusts other devices that affect processing parameters, such as a temperature control system, which in turn receives input from temperature sensors and adjusts power to radiant heaters outside the chamber 300, and the vacuum pump 362. The controller 250 is thus programmed to implement process recipes, such as the simultaneous or the sequential selective epitaxial formation processes described above.

The embodiment shown in FIGS. 3-5 provides first and second inlet manifolds 210, 220 injecting gases from above and below into the reaction space 340. Reactants from the reactant sources 10, 20 thus flow from opposite walls or opposite directions into the reaction space 340. The skilled artisan will appreciate that some of the advantages of the equipment and processes taught herein will be obtained with other geometric configurations.

As illustrated in FIG. 3, the substrate 80 is located within the reaction space 340, and the reactant gases may flow freely without being subjected to any flow restrictions from the mixing space 342 to the substrate 80. The width of the portion of the reaction space 340 containing the mixing space 342 can be at least as wide as the substrate 80, and in the illustrated embodiment the mixing space 342 is within the wafer insertion opening 341, which is sized and shaped to pass a substrate 80 through it for loading and unloading. The lack of flow restrictions means that the reactant gases are not subjected to increased pressure at the mixing point, where interaction is possible. Accordingly, premature semiconductor deposition or other unwanted e.g., explosive, reactions can be avoided. The pressure differential may be substantially zero between the mixing space 342 and the substrate 80. In some embodiments, however, the pressure differential may be negative, which is to say the pressure may decrease between the mixing space 342 and the substrate 80. In some embodiments, temperature in the reaction space 340 is below about 750° C., and particularly between about 500° C. and about 600° C. Total pressure in the reaction space 340 may be between 1 Torr and 200 Torr.

Example 1

Sequential Flow of Trisilane and $Cl_2$

In one process according to embodiments of the invention, a blanket (non-selective) deposition was carried out using trisilane, along with methyl silane as a carbon source and phosphine as a dopant. This process was carried out using the equipment described above, with separated inlets into the reaction space. The temperature in the reaction space during the deposition was approximately 550° C., and the pressure was approximately 100 Torr. Next, a purge was performed for five seconds and the pressure was reduced to approximately 10 Torr. The etch phase was then carried out using $Cl_2$. This process was found to avoid the problem of premature silicon deposition. The flow rates of gases in this process can be optimized to balance speed and uniformity. As noted above, sequential blanket deposition processes can be performed over a patterned substrate having insulating and single-crystal silicon surfaces. During the blanket deposition, epitaxial semiconductor material is left on single-crystal semiconductor windows of the patterned substrate, while nonepitaxial material is left on other surfaces, such as insulators. The subsequent etch phase can then remove the nonepitaxial material. Etch rate selectivity, defined as the etch rate of amorphous material divided by the etch rate of the single-crystal, was found to be greater than 7.

Example 2

Simultaneous Flow of DCS and $Cl_2$

In another process according embodiments of the invention, the silicon precursor DCS was introduced simultaneously with the etchant $Cl_2$ along with methyl silane as a carbon source and phosphine as a dopant. This process was carried out using the equipment described above, with separated inlets into the reaction space. Reaction space temperature was between about 550° C. and about 600° C., and pressure in the reaction space was atmospheric. The flow rate for DCS was about 500 sccm. The flow rate for $Cl_2$ was between about 3 sccm and about 10 sccm. This process was found to avoid the problem of premature silicon deposition.

Example 3

Simultaneous Flow of Trisilane and $Cl_2$

In another process according to embodiments of the invention, the silicon precursor trisilane was introduced simultaneously with the etchant $Cl_2$. This process was carried out using the equipment described above, with separated inlets into the reaction space. Reaction space temperature was between about 525° C. and about 575° C., and pressure in the reaction space was between about 4 Torr and about 32 Torr. Trisilane was introduced at a flow rate of about 50 mg/min for about 10 minutes, while about 200 sccm $Cl_2$ and about 100 sccm of 1% phosphine was simultaneously introduced. This process was found to avoid the problem of premature silicon deposition, and selectivity of the deposition was found to be acceptable.

The foregoing embodiments provide methods and equipment for separately providing precursors for semiconductor deposition and etchants that provide selectivity. The first intersection, or mixing space, for these two reactants is within the relatively spacious reaction space, rather than upstream manifolds and gas panels. By avoiding interaction within the tight confines of portion flow paths upstream of the reaction space, potentially harmful reactions are avoided or such reactions take place within the reaction space where reactions are not confined to a small volume, pressures can be kept lower, and less damage is incurred. Advantages are obtained whether the precursors and etchants for selective film formation are supplied simultaneously or in sequential steps.

Although this invention has been disclosed in the context of certain embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

What is claimed is:

1. A method for selectively forming a semiconductor layer on a substrate in a reaction space, the substrate comprising a first surface and a second surface, the method comprising:
   separately introducing a precursor for semiconductor deposition and a vapor etchant through separate flow paths into the reaction space;
   exposing the substrate to the precursor and the vapor etchant; and
   selectively forming the semiconductor layer on the first surface at a greater mean rate than the second surface
   wherein separately introducing comprises introducing the precursor and the vapor etchant from opposite directions into the reaction space.

2. The method of claim 1, wherein separately introducing and exposing comprises:
   introducing the precursor into the reaction space to deposit a blanket layer over both the first surface and the second surface; and
   subsequently introducing the vapor etchant to selectively remove the blanket layer from the second surface while leaving at least some of the blanket layer on the first surface.

3. The method of claim 2, further comprising cyclically repeating introducing the precursor to deposit a blanket layer and subsequently introducing the vapor etchant to selectively remove.

4. The method of claim 1, wherein the separate flow paths for the precursor and the vapor etchant intersect at a mixing space within the reaction space and form a common flow path from the mixing space to the substrate, wherein the common flow path encounters no flow restrictions between the mixing point and the substrate.

5. The method of claim 1, further comprising maintaining the reaction space at a pressure between about 1 Torr and 200 Torr during separately introducing, exposing and selectively forming.

6. The method of claim 1, wherein introducing comprises simultaneously introducing both of the precursor and the vapor etchant into the reaction chamber.

7. The method of claim 1, wherein the first and second surfaces have different surface morphologies.

8. The method of claim 1, wherein the precursor comprises at least one element selected from the group consisting of silicon, carbon, and germanium.

9. The method of claim 1, wherein separately introducing comprises separately introducing trisilane and chlorine gas.

10. The method of claim 1, wherein the precursor and the vapor etchant can react with one another in a reaction that is at least as exothermic as a reaction between dichlorosilane and chlorine gas.

11. The method of claim 1, wherein selectively forming comprises epitaxially depositing the semiconductor layer on the first surface without net deposition on the second surface, wherein the second surface comprises an insulator.

12. The method of claim 1, wherein the vapor etchant comprises diatomic chlorine ($Cl_2$).

13. A method for selectively forming a semiconductor layer on a substrate in a reaction space, the substrate comprising a first surface and a second surface, the method comprising:
    separately introducing a precursor for semiconductor deposition and a vapor etchant through separate inlets defining separate flow paths for the precursor and vapor etchant into the reaction space;
    exposing the substrate to the precursor and the vapor etchant; and
    selectively forming the semiconductor layer on the first surface at a greater mean rate than the second surface
    wherein separately introducing comprises introducing the precursor and the vapor etchant from opposite directions into the reaction space.

* * * * *